United States Patent
Chauvel et al.

[11] Patent Number: 5,475,644
[45] Date of Patent: Dec. 12, 1995

[54] CROSSPOINT MEMORY

[75] Inventors: Gerard Chauvel, Antibes; Sebastiano D'Arrigo, Cannes, both of France

[73] Assignee: Texas Instruments Incorporated, Dallas, Tex.

[21] Appl. No.: 204,111

[22] Filed: Mar. 1, 1994

[30] Foreign Application Priority Data

Mar. 1, 1993 [FR] France .................. 93 02330

[51] Int. Cl.$^6$ .............. G11C 13/00; G11C 7/00
[52] U.S. Cl. .............. 365/221; 365/230.03; 365/230.65; 365/189.02; 365/230.04
[58] Field of Search ............... 365/221, 230.03, 365/230.05, 230.04, 189.02, 233

[56] References Cited

U.S. PATENT DOCUMENTS

| | | | |
|---|---|---|---|
| 4,779,234 | 10/1988 | Kaneko et al. | 365/221 |
| 5,027,326 | 6/1991 | Jones | 365/221 |
| 5,117,395 | 5/1992 | Hashimoto | 365/221 |

Primary Examiner—David C. Nelms
Assistant Examiner—Huan Hoang
Attorney, Agent, or Firm—William E. Hiller; Richard L. Donaldson

[57] ABSTRACT

Interconnection-pin memory comprising an array of dual-port switching memories used as first-in, first-out devices, characterized in that each dual-port memory (3, 4) of the memory array includes a write-only port (15, 23) and a read-only port (18, 19, 20, 21) having separate address and control signals.

3 Claims, 4 Drawing Sheets

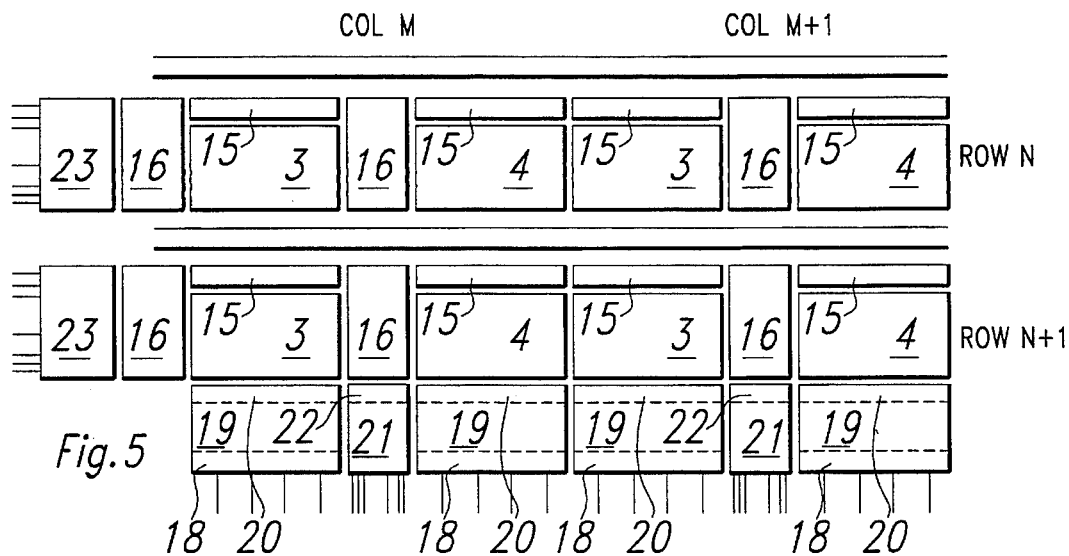
Fig. 5
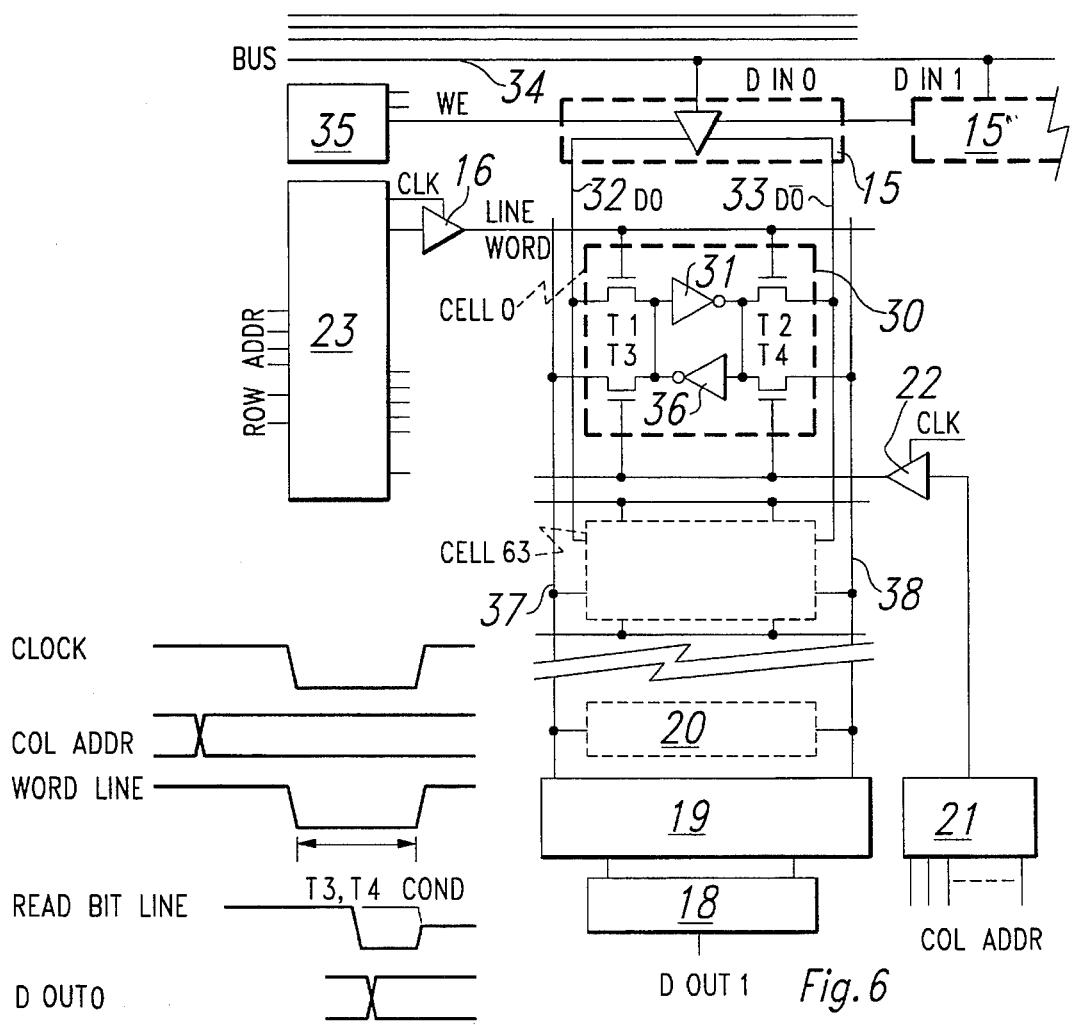
Fig. 6
Fig. 8

CROSSPOINT MEMORY

The present invention relates to the transmission of data and refers more particularly to the transmission of data between telecommunications terminals operating at different frequencies.

Applications in the field of telecommunications and informatics are tending ever more to the use of a standard with asynchronous transfer mode ATM for transferring data between terminals. In general, the sender and the receiver operate at different frequencies. The key element of an asynchronous transfer mode ATM is the switching array which establishes the connection and synchronizes the sender with the receiver.

A two-dimensional switching array of the aforesaid type connects input data originating from senders each operating at a different frequency to outputs connected to receivers each operating at a different frequency from that of the sender with which it is communicating.

The switching array therefore has two principal functions:

a) to establish one or more connections between terminals, and b) to match the frequency of the data transmitted.

The switching element operates as a first-in, first-out FIFO device.

The clock signal which determines the rate of the input signals originating from a first sender controls the storage of these input data at the address defined by a write address pointer. The clock frequency depends on the frequency of the input data originating from the first sender and increments the address pointer.

A clock signal corresponding to the frequency of the output data controls the read cycle of the FIFO. A read address pointer selects a datum in the FIFO. The read datum appears on the output connected to the corresponding receiver. The clock signal corresponding to the frequency of the output data controls the incrementation of an address read register. The size of the FIFO device depends on the difference in frequency between the input and the output of the data and on the number of information items to be transmitted.

The write and read pointers operate under cyclic addressing. When the address of one or the other of the pointers is at the bottom of the FIFO register, the next address is at the top of the FIFO register. Equality between the write and read address pointers establishes the clear signal.

When the read pointer catches up with the write pointer, when there is equality between the two pointers, the buffer is clear. When the write pointer catches up with the read pointer, the buffer is full.

The write cycle corresponding to the equality of the pointers is disabled.

A conventional switching array is formed of switching elements organized into rows and columns. A clock and data input bus connects the switching elements row by row.

A clock and data output bus connects the switching elements column by column.

For a switch having a dual-port memory architecture, access to the storage elements of the memory requires, for each port, logic blocks associated with the storage elements such as input buffer circuits, preloading circuits, detection amplifiers, address command and decoding means, decoding circuits X and word line command circuits.

The result of this is that the working area of the dual-port storage elements represents a small portion of the total memory area.

In the case for example of a 64-byte dual-port memory, the total areas of all the aforesaid logic blocks represent 75% of the area of the memory.

Such an arrangement makes the memory bulky and expensive from the viewpoint of the silicon area used.

The invention aims to remedy this disadvantage by creating an array-like memory device whose command logic circuits occupy only a minimum area of the total area of the memory.

Its subject is therefore a memory with interconnection pins and comprising an array of dual-port switching memories used as first-in, first-out devices, characterized in that each dual-port memory of the memory array includes a write-only port and a read-only port having separate address and control signals.

The invention will be better understood with the aid of the description which follows, given merely by way of example and provided with reference to the attached drawings in which:

FIG. 5 is a partial view of the internal structure of a dual-port memory network arranged according to the invention;

FIG. 6 is a diagram of one column of the memory network of FIG. 5;

FIG. 8 is a chart representing the signals involved in a read cycle;

Figure 1:
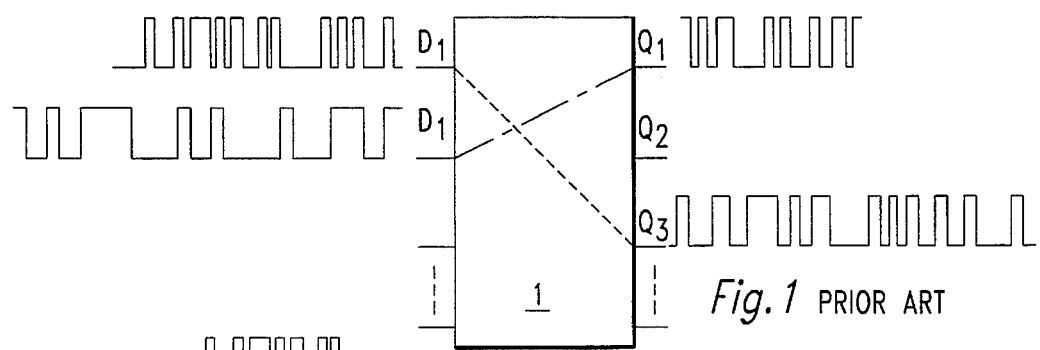
FIG. 1 is a diagrammatic view of an asynchronous transfer mode switching array of known type.

Represented in FIG. 1 is a two-dimensional asynchronous transfer mode switching array 1 of known type.

The array includes inputs D1, D2, . . . , intended to be connected to senders each operating at a different frequency as shown by the corresponding input signals and outputs Q1, Q2, Q3 . . . intended to be connected to receivers which each operate at a different frequency from that of the sender with which they are communicating.

This array connects the input data D1 to the output Q3 and the input data D2 to the output Q1 in the course of the same time period.

The rate of the input data D1 is in the present example greater than that of the output data Q3 requested by the terminal connected to the output Q3.

In the second connection D2-Q1, the rate of input data D2 is less than the rate of the output data Q1.

As already indicated earlier, the switching array must therefore principally:

a) establish one or more connections between terminals;

b) match the frequency of the data transmitted.

Figure 2:
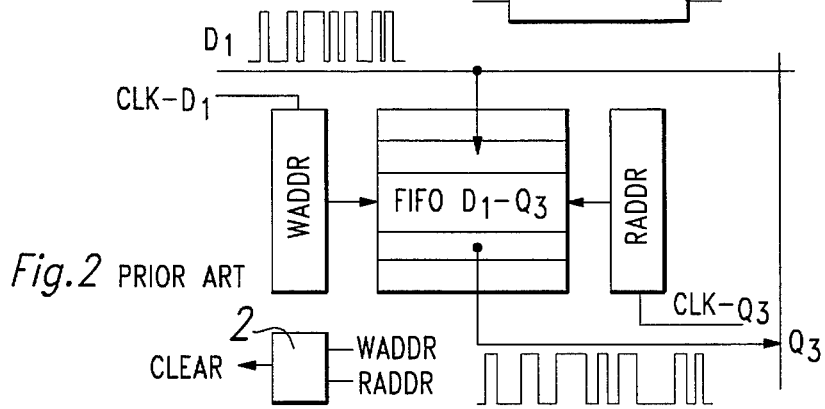
FIG. 2 is a diagrammatic view of a switching element coming into the construction of the array of FIG. 1.

To this end, the switching array is formed of switching elements such as that represented in FIG. 2.

There has been described, by way of example, the switching element establishing the link between the input D1 and the output Q3.

It includes principally a FIFO device denoted by FIFO D1-Q3 connected on the one hand to the input D1 and on the other hand to the output Q3 and with which are associated a write address pointer Waddr controlled by a clock signal Clk-D1 and a read address pointer Radd2 controlled by a clock signal Clk–Q3.

The clock signal Clk-D1 controls the storage of the input data D1 at the address defined by the write address pointer Waddr. The frequency of the clock signal Clk-D1 depends on the frequency of the input data D1.

The signal Clk-D1 increments the address pointer Waddr.

The clock signal Clk-Q3 controls the read cycle of the FIFO. The read address pointer Raddr selects a datum in the FIFO.

The read datum appears on the output Q3.

The clock signal Clk-Q3 controls the incrementation of the address read register Raddr.

The size of the FIFO register depends on the difference in frequency between the input and the output of the data.

The pointers Waddr and Raddr operate under cyclic addressing. When the address of the pointer Waddr or of the pointer Raddr is at the bottom of the FIFO register, the next address is at the top of the FIFO register.

Equality between the address pointers Waddr and Raddr establishes the clear signal determined by a status register 2 associated with the FIFO represented in FIG. 2.

The write cycle is then disabled.

A switching array with four rows and four columns, represented in FIG. 3, will now be described.

A clock Clkin and data input Din bus connects the switching elements FIFO 00 to FIFO 33 row by row.

Therefore, in the present example, there are four clock and data input buses.

Din 0 Clkin 0, Din 1Clkin 1, Din 2 Clkin 2 and Din 3 Clkin 3.

A clock Clkout and data output Dout bus connects the switching elements FIFO 00 to FIFO 33 column by column.

Therefore, there are likewise four buses Dout 0 Clkout 0 to Dout 3 Clkout 3.

Figure 3:
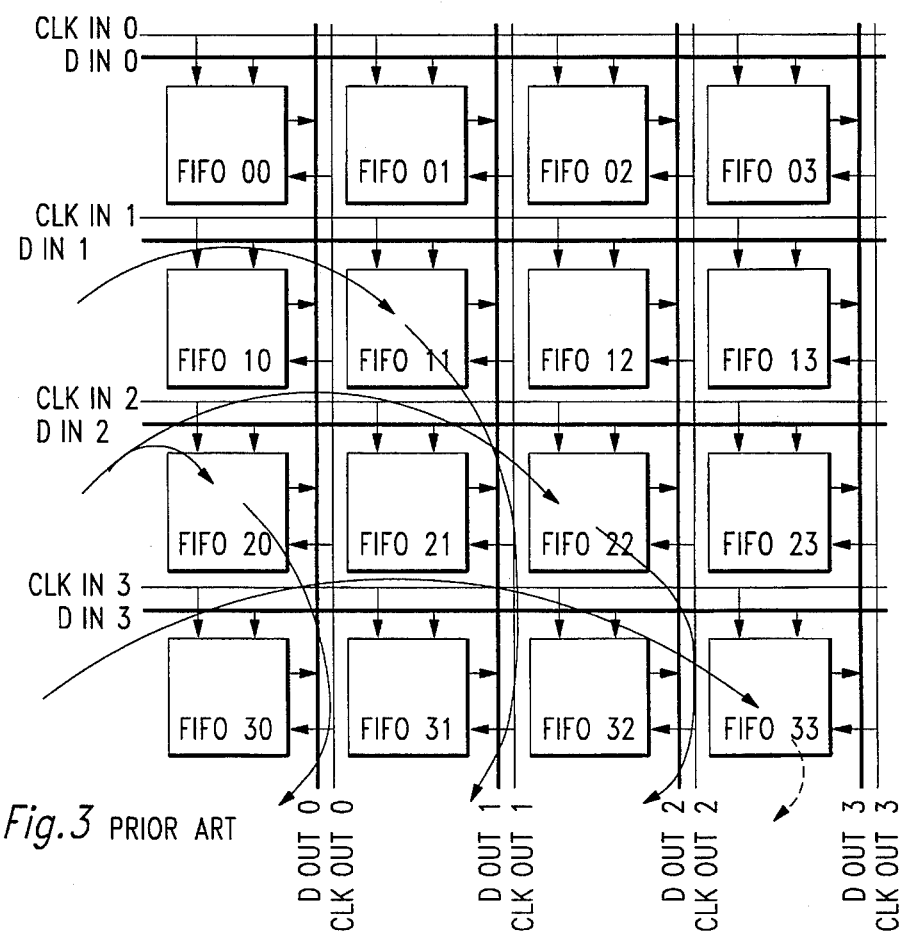
FIG. 3 is a more detailed diagrammatic view of a switching array of known type with four rows and four columns of switching elements.

In FIG. 3, three asynchronous data transfers represented by arrows are in progress. The first between Din 1 and Dout 1, the second between Din 2 and Dout 0 and Dout 2 and the third between Din 3 and Dout 3. At a given instant, only one FIFO is read per column. In each row Din can be transferred into one of the various switching elements FIFO 00 to FIFO 33.

The implementation of a FIFO device is carried out as follows. A small FIFO generally uses a register cell as memory cell. Each register cell requires sixteen to twenty transistors. The registers require additional logic blocks to provide for the decoding and to generate write and read addresses so as to connect the outputs of the FIFOs to the output buses and to generate a "clear" signal.

A FIFO of larger dimension uses memory cells instead of register cells so as to reduce the size of the storage elements. A dual-port memory cell includes only eight transistors per cell.

Figure 4:
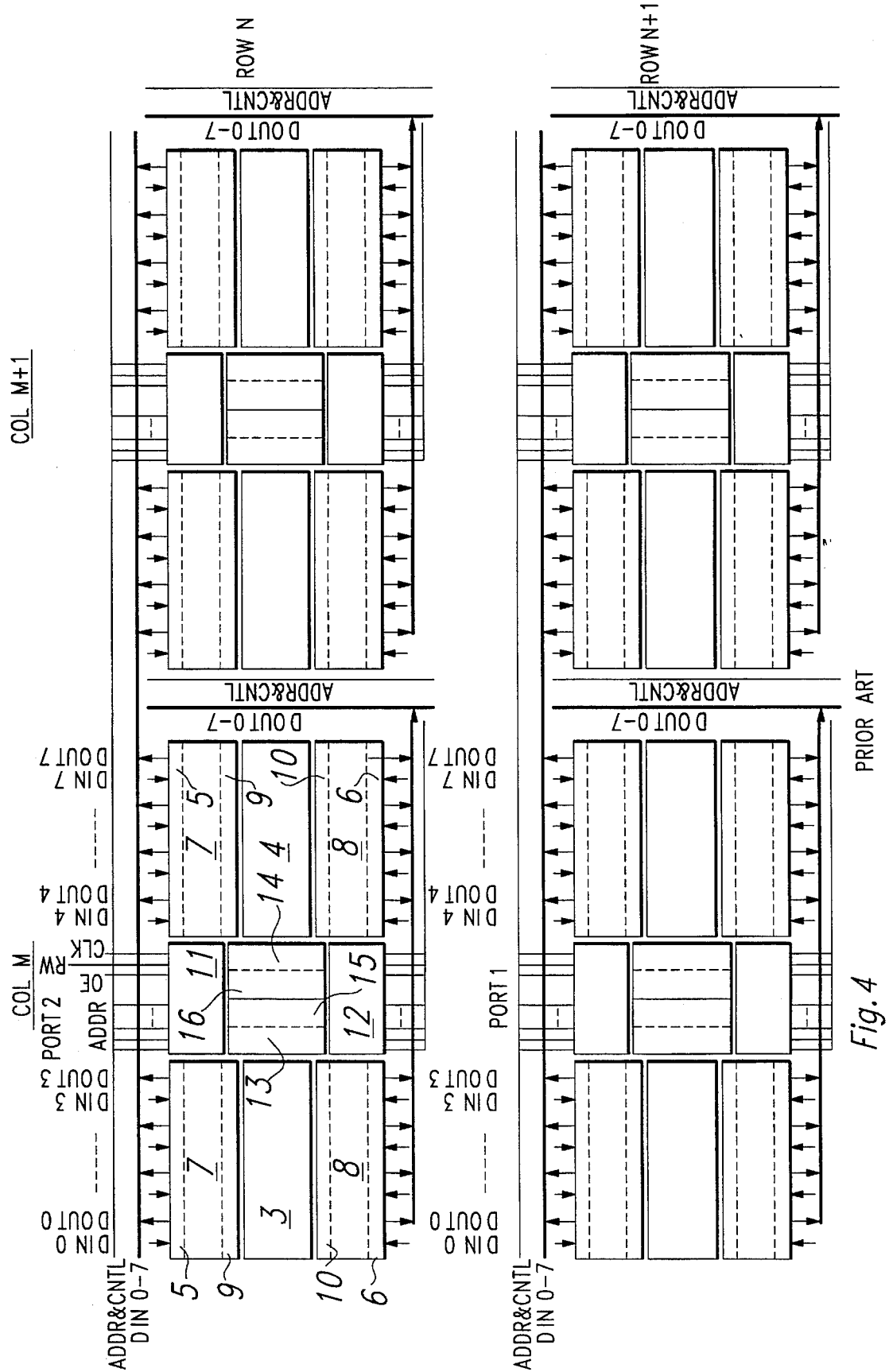
FIG. 4 is a partial view of the internal structure of a dual-port memory network of conventional type.

FIG. 4 represents four 64-byte dual-port memories arranged as a switching array. Ports 1 and 2 of each memory are symmetric and each comprise: a data input with eight lines Din-0 to Din-7; a data output with eight lines Dout-0 to Dout-7; six address lines for selecting one byte from 64, an output enable OE controlling a three-state output; a read/write signal RW and a clock Clk.

By comparison with the register cells, the dimension of a 64-byte FIFO using a dual-port memory cell is smaller. However, in the known arrangements, the area of the storage elements of the dual-port memory uses a small portion of the total memory area. This is due to the extra logic blocks which are required to access the storage elements of the memory.

Indeed, each 64-byte dual-port memory represented in FIG. 4 and only one of which is detailed here includes two 32-byte memory cells 3 and 4.

To each memory cell is connected an input/output buffer circuit 5,6, a detection amplifier 7,8 and a preload circuit 9,10 associated with each port.

Further, each dual-port memory includes, for each port, a decoding and address command circuit 11,12 and, for accessing each memory cell, word line command elements 13,14 and X decoding circuits, 15,16.

In the case of a 64-byte dual-port memory, the total areas of all these blocks represent 75% of the area of the memory. The storage elements of the 64-byte memory have an area of 25% of the total area of the memory.

Access to the dual-port memory will now be described.

The four dual-port memories of FIG. 4 are arranged as a switching array and lie in columns M and M+1 and rows N and N+1 of this array.

An input data bus Din 0 to 7 and address and control signal buses connect the memories row by row. Address and control signal data output buses Dout-0 to 7 connect the memories column by column.

A large integrated switching array cannot use such an arrangement.

Each memory is too big by virtue of the poor ratio between the area of the memory cell and the total area. The routing factor is large by virtue of the numerous buses for address data and row and column control. Electrical performance is limited by the length of the buses.

The memory with connection pins according to the invention exhibits an architecture which considerably improves the ratio between the area of the memory cell and the total area and improves the electrical performance. Generally, a memory is defined by two parameters: the number of words and the number of bits per word.

The memory with interconnection pins is a network of two-port memories. The parameters defining the structure are the number of words and the number of bits per word for a two-port memory element or the number of columns and the number of rows of memory elements.

In the application to a switching array, each two-port memory block is used as FIFO.

According to the invention, the FIFO command logic is external to the interconnection-pin memory. A dual-port memory network arrangement according to the invention is represented in FIG. 5.

This is a portion of a switching array corresponding to the portion of conventional array represented in FIG. 4.

It is seen in FIG. 5 that each 64-byte memory includes two 32-byte elements 3 and 4 with each of which is associated an input buffer circuit 15 and a word line command circuit 16.

On the other hand, this arrangement can be implemented in operation or modified so as to include only a single output buffer circuit 18, a single detection amplifier 19, a single preload circuit 20, a single decoding and address command circuit 21 and a single Y decoding circuit 22 per column as well as a single decoding and address command circuit 23 per row.

Each two-port memory block represented in FIG. 5 includes a write-only port and a read-only port. The write and read ports have separate address and control signals.

A two-port memory block includes no detection preload amplifier and input/output block which are associated therewith.

Address decoders for the word line command devices and control signals are common to a row of two-port memory blocks.

The data command and write enable buses of each row interconnect each two-port memory block across an input buffer. A write enable signal controls each input buffer independently.

The preload, detection amplifier and output blocks are common to a column. Each column of the interconnection-pin memory includes separate address decoders, word line command devices and control signals.

There is no bus for data output signals or for control signals in the column direction.

The write cycle is independent for each row of the memory array.

The same data can be written at the same address in one or more two-port memory blocks. This is controlled by the write enable signal.

The read cycle is independent for each column. One word only is read from a column.

FIG. 6 represents the detail of a memory cell according to the invention and the logic blocks for accessing the write and read cycles.

FIG. 6 represents the bit Din-0.

It comprises sixty four memory cells 30 laid out in a column, each memory cell being formed by a pair of transistors T1, T2 with an inverting amplifier 31 interposed between them, and they are connected to two write lines 32,33, the latter connected to a corresponding input buffer circuit 15. In FIG. 6 only the first cell is detailed.

The input buffer circuit 15 is a three-state circuit including a data input Din-0 connected to the bus 34 for row data input, a write enable command input WE connected to the output of a column selection circuit 35 and two outputs delivering complementary states D0, D0 as a function of the states of the signals DIN-0 and WE on its corresponding inputs.

The write lines 32 and 33 are connected only to the 64 cells of the bit Din0 of a FIFO.

Other write lines (not represented) are connected to the other FIFOs of the same column of the interconnection-pin memory according to the invention.

Each memory cell 30 further includes another pair of transistors T3, T4 with an inverting amplifier 36 interposed between them, each connected to two read lines 37,38. The read lines are not only connected to all the cells of a column of the relevant FIFO but also to the cells of the corresponding columns of the other FIFOs of a column of the interconnection-pin memory.

The read lines 37, 38 of a column are connected to a preload circuit 20, to a detection amplifier 19 and to an output buffer circuit 18 which are common to this column with the interconnection-pin array.

This arrangement is supplemented with a decoding and write address command circuit 23, receiving on its inputs the addresses of the rows and connected via its outputs by way of word line command circuits, such as 16, to the pairs of write transistors T1, T2 of the rows of a FIFO.

The decoding and write address command circuit 23 is itself common to a row of FIFOs of the interconnection-pin memory.

It delivers a clock signal Clk to the word line command circuits 16.

A detector and read command circuit 21 common to a FIFO receives on its inputs column addresses and is connected at its output to the pairs of read transistors T3, T4 by way of word read line command circuits 21 receiving on their command input a clock signal Clk.

Write port: the input data bus 34 Din-0 to Din-7 is connected bit by bit to the input buffer 15 of each two-port memory block 3,4 (FIG. 5). The write bit lines 32,33 are separate in each dual-port memory block. The write enable signal WE controls the output state of the input buffer 15 buffer by buffer. The decoder and write address command circuit 23 decodes the row addresses and selects the corresponding word line in all the dual-port memory blocks of a row.

Read port: decoder and read address command circuit 21 decodes the address of the column and selects the corresponding word line in the column of the dual-port memory block. The read bit lines 37,38 which connect the memory cells are common to a column. The read bit lines are connected to the detection amplifier 19 and to the preload circuit 20.

The operation of this portion of the FIFO is as follows.

Figure 7:
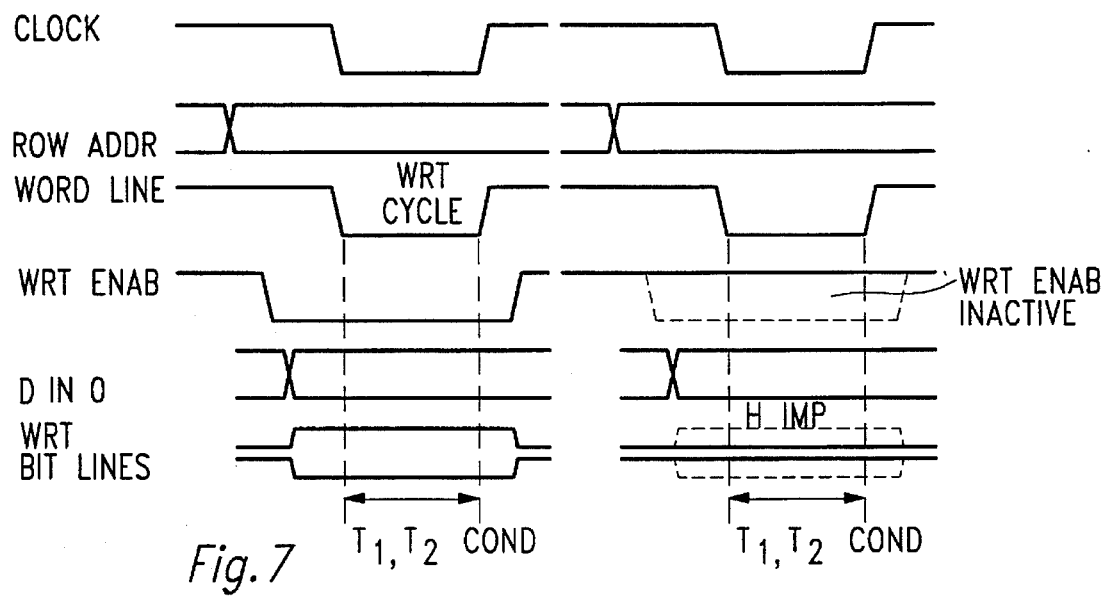
FIG. 7 is a chart representing the signals involved in a write cycle.

Write cycle: as shown by the chart of FIG. 7, the row address selects the word lines. During the clock signal Clk, the word line signal is active, all the transistors T1 and T2 of the word line are on. The column selection circuit 35 common to a row generates write enable signals WE for all the dual-port memory blocks which are selected. Each dual-port memory block has a separate write enable line. If the write enable is active, the write bit lines 32,33 are set to the corresponding level 01 or 10 depending on Din-0. The data input is transferred to the corresponding memory cell 30. If the write enable signals WE are inactive, the bit lines 32, 33 are at a high-impedance level. The memory bit cell is unassigned.

Read cycle: the read cycle is controlled by the clock signal Clk. At the start of the cycle, the read bit lines 37,38 are preloaded.

As shown by FIG. 8, the column address selects a word line in a dual-port memory block of a column. The transistors T3 and T4 are on when the word lines and the clock signal Clk are active. The contents of the selected memory cells are transferred on the read bit lines 37,38. The detector amplifier 19 amplifies the signal so as to generate output data Dout-0 across the output buffer 18.

Figure 9:
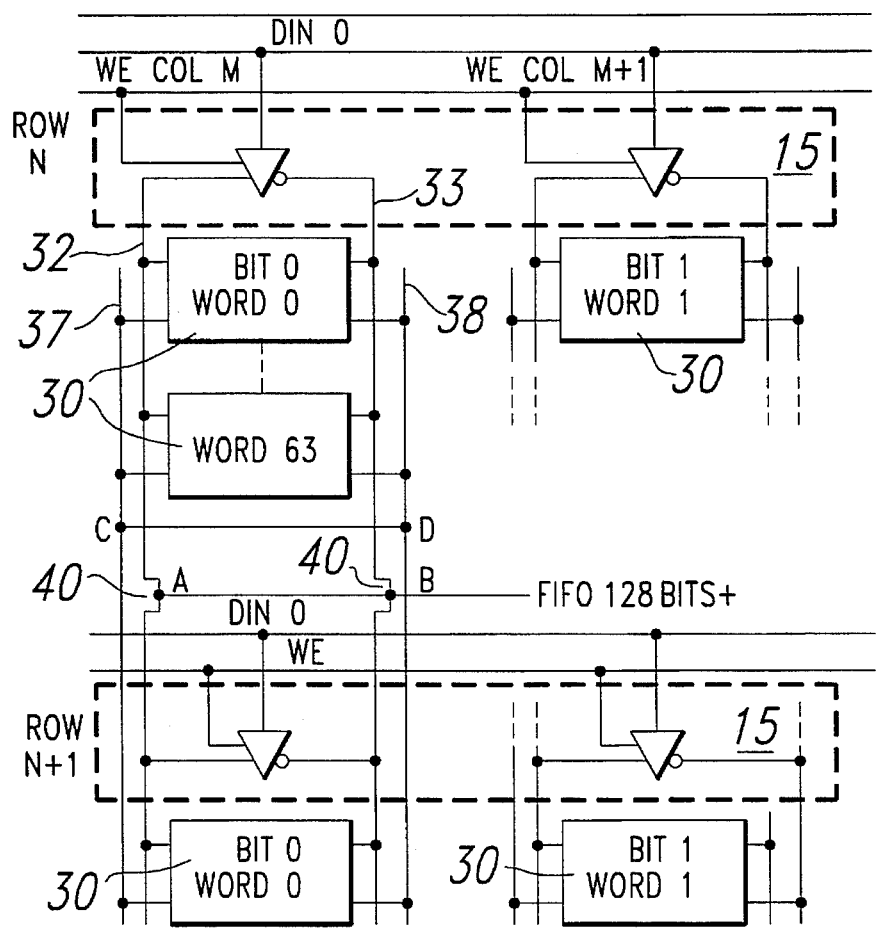
FIG. 9 is a diagram of a modifiable variant of the organization of the memory network according to the invention.

Represented in FIG. 9 is a variant of a column of an interconnection-pin memory according to the invention.

This arrangement is similar to that described with reference to FIG. 6 and differs therefrom only in that between the bits of consecutive FIFO devices of a column of the interconnection-pin memory are connected switches 40 intended for connecting the write lines 32,33 of two corresponding words of consecutive FIFOs so as if necessary to raise the storage capacity of a FIFO. The switches 40 are in fact transistors connected to each write line and controlled externally when configuring the interconnection-pin memory.

The arrangement just described makes it possible to obtain interconnection-pin memories requiring a silicon area of around a quarter that of the conventional dual-port interconnection-pin memory.

Furthermore, the major portion of the logic circuits for controlling the FIFO devices are external to the interconnection-pin memory proper.

We claim:

1. A memory having interconnection pins and comprising:
   an array of dual-port switching memories implemented as first-in, first-out memory devices;
   each of said dual-port switching memories comprising a plurality of memory cells arranged in a matrix of rows and columns and respectively defined by memory elements, the memory elements of each of said memory cells providing a respective bit of the dual-port switching memory in which the memory cell is located;

each of said dual-port switching memories included in the array of dual-port switching memories including a write-only port and a read-only port having separate address and control signals;

the write-only port of each of said dual-port switching memories having an input buffer;

a data input bus to which said input buffer of each of said dual-port switching memories is connected bit by bit;

separate write lines for each bit of a respective dual-port switching memory connected between the input buffer and the memory elements providing the bit of the dual-port switching memory;

a column selection circuit connected to the input buffers of each row of dual-port switching memories by write enable lines for delivering to the input buffers corresponding write enable signals which are separate for each input buffer of each row;

a decoder and write address command circuit common to each row of dual-port switching memories for decoding the row addresses and for selecting the corresponding word line in all of the dual-port switching memories of a row of the array of dual-port switching memories; and externally controlled switches interconnecting the write lines of the dual-port switching memories of one column of the array of dual-port switching memories for modifying, upon request, the storage capacity of a dual-port switching memory, thereby modifying the first-in, first-out memory device implemented thereby.

2. A memory as set forth in claim 1, wherein the read-only port of each of said dual-port switching memories is provided with read lines common to the dual-port switching memories of each column of the array of dual-port switching memories;

a decoder and read address command circuit for decoding the address of the column and for selecting the corresponding word line in the column of dual-port switching memories from the read lines;

a detection amplifier common to each column of the dual-port switching memories; and said read lines being connected to said detection amplifier.

3. A memory as set forth in claim 2, further including a preload circuit and an output buffer circuit common to each column of dual-port switching memories of the array of dual-port switching memories.

* * * * *